(12) United States Patent
Li et al.

(10) Patent No.: US 10,249,617 B2
(45) Date of Patent: Apr. 2, 2019

(54) TUNABLE DEVICE HAVING A FET INTEGRATED WITH A BJT

(71) Applicant: Skyworks Solutions, Inc., Woburn, MA (US)

(72) Inventors: Bin Li, Camarillo, CA (US); Peter J. Zampardi, Jr., Newbury Park, CA (US); Andre G. Metzger, Newbury Park, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/348,878

(22) Filed: Nov. 10, 2016

(65) Prior Publication Data

US 2017/0221880 A1   Aug. 3, 2017

Related U.S. Application Data

(63) Continuation of application No. 14/709,780, filed on May 12, 2015, now Pat. No. 9,525,078, which is a continuation of application No. 13/427,488, filed on Mar. 22, 2012, now Pat. No. 9,059,332, which is a
(Continued)

(51) Int. Cl.
| | | |
|---|---|---|
| G05F 1/10 | (2006.01) |
| H01L 27/06 | (2006.01) |
| H01L 21/8249 | (2006.01) |
| H01L 27/08 | (2006.01) |
| H01L 29/93 | (2006.01) |
| H01L 29/94 | (2006.01) |

(Continued)

(52) U.S. Cl.
CPC ...... *H01L 27/0635* (2013.01); *H01L 21/8249* (2013.01); *H01L 27/0605* (2013.01); *H01L 27/0623* (2013.01); *H01L 27/0808* (2013.01); *H01L 27/0811* (2013.01); *H01L 29/1095* (2013.01); *H01L 29/93* (2013.01); *H01L 29/94* (2013.01); *H03J 3/185* (2013.01)

(58) Field of Classification Search
CPC ......... H01L 2924/0002; H01L 2924/00; H01L 21/0254; C30B 29/403
See application file for complete search history.

(56) References Cited

U.S. PATENT DOCUMENTS

| | | |
|---|---|---|
| 4,639,761 A | 1/1987 | Singer et al. |
| 5,027,177 A | 6/1991 | Vasudev |
| 5,250,826 A | 10/1993 | Chang et al. |

(Continued)

FOREIGN PATENT DOCUMENTS

| | | |
|---|---|---|
| CN | 1536678 A | 10/2004 |
| CN | 102742016 A | 10/2012 |

(Continued)

OTHER PUBLICATIONS

International Search Report and Written Opinion re International Application No. PCT/US2009/059305, dated Jun. 17, 2010, in 9 pages.

*Primary Examiner* — Sibin Chen
(74) *Attorney, Agent, or Firm* — Knobbe, Martens, Olson and Bear, LLP

(57) ABSTRACT

A device includes a field effect transistor (FET) integrated with at least a portion of a bipolar junction transistor (BJT), in which a back gate of the FET shares an electrical connection with a base of the BJT, and in which a reverse voltage can be applied to the back gate of the FET.

20 Claims, 7 Drawing Sheets

Related U.S. Application Data continuation-in-part of application No. PCT/US2009/059305, filed on Oct. 2, 2009.

(51) Int. Cl.
  *H03J 3/18* (2006.01)
  *H01L 29/10* (2006.01)

(56) References Cited

U.S. PATENT DOCUMENTS

| | | |
|---|---|---|
| 7,132,901 B2 | 11/2006 | Cojocaru |
| 9,059,332 B2 | 6/2015 | Li et al. |
| 9,525,078 B2 | 12/2016 | Li et al. |
| 2004/0061565 A1* | 4/2004 | Austin .................. H03B 5/1852 331/177 V |
| 2004/0201045 A1 | 10/2004 | Kurosawa et al. |
| 2004/0201052 A1 | 10/2004 | Nakashiba |
| 2004/0214383 A1 | 10/2004 | Altman |
| 2005/0068117 A1 | 3/2005 | Banerjee et al. |
| 2005/0122755 A1 | 6/2005 | Tsutsumi et al. |
| 2005/0231296 A1* | 10/2005 | Souetinov ............ H03B 5/1228 331/177 V |
| 2007/0080754 A1 | 4/2007 | Park et al. |
| 2008/0237736 A1 | 10/2008 | Sakurai et al. |
| 2009/0033428 A1* | 2/2009 | Karri .................... H03B 5/1228 331/17 |
| 2009/0179695 A1 | 7/2009 | Siprak et al. |
| 2009/0201084 A1* | 8/2009 | See ....................... H03F 1/0244 330/51 |
| 2009/0325521 A1* | 12/2009 | Dubash .................. H04B 1/28 455/150.1 |

FOREIGN PATENT DOCUMENTS

| | | |
|---|---|---|
| KR | 10-1598655 | 2/2016 |
| WO | WO 2011/040927 | 4/2011 |

\* cited by examiner

ITED STATES PATENT

TUNABLE DEVICE HAVING A FET INTEGRATED WITH A BJT

CROSS-REFERENCE TO RELATED APPLICATIONS

This application is a continuation of U.S. patent application Ser. No. 14/709,780, now U.S. Pat. No. 9,525,078, filed May 12, 2015, entitled "TUNABLE DEVICE HAVING A FET INTEGRATED WITH A BJT," which is a continuation of U.S. application Ser. No. 13/427,488, now U.S. Pat. No. 9,059,332, filed Mar. 22, 2012, entitled "CONTINUOUS TUNABLE LC RESONATOR USING A FET AS A VARACTOR," which is a continuation-in-part of International Application No. PCT/US2009/059305, filed Oct. 2, 2009, entitled "CONTINUOUS TUNABLE LC RESONATOR USING A FET AS A VARACTOR." The entireties of each of the foregoing applications are incorporated by reference herein.

BACKGROUND

A varactor diode, commonly referred to as a varactor, is a type of PN junction diode that has a high junction capacitance when reverse biased. The capacitance is variable and is a function of the voltage applied at its terminals. Such devices having a variable, or tunable capacitance, are commonly used in inductive (L) capacitive (C) (LC) resonant circuits that are used as tuning circuits, for impedance matching or as isolation circuits.

One technology for fabricating semiconductor devices is a merged gallium arsenide (GaAs) Heterojunction Bipolar Transistor (HBT)—Field Effect Transistor (FET) technology, where the FET is a specialized device integrated with the HBT having characteristics similar to a depletion-mode (d-mode) Metal Semiconductor Field Effect Transistor (MESFET), where a MESFET is a specialized FET. This integrated technology is commonly referred to as "BiFET," but alternative nomenclature and integration techniques exist to combine an HBT and a FET on GaAs.

Other semiconductor technologies can also be used to create a FET. One example is complementary metal oxide semiconductor (CMOS) technology which integrates both n-type and p-type e-mode MOSFETs onto the same silicon substrate. Regardless of the technology used to fabricate a FET, when the device is off, the FET can be controlled to exhibit a variable capacitance. Therefore, it would be desirable to have a way of using a FET as a varactor. If the varactor could be implemented such that it had a wide tuning range with continuously tunable characteristics, it could be used in tunable LC circuits, tunable RF matching networks, and any other application requiring an electronically tunable capacitance.

SUMMARY

Embodiments of the invention include a varactor comprising a field effect transistor (FET) integrated with at least a portion of a bipolar junction transistor (BJT), in which a back gate of the FET shares an electrical connection with a base of the BJT, and in which a reverse voltage applied to the back gate of the FET creates a continuously variable capacitance in a channel of the FET.

Other embodiments are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, but illustrate the principles of the invention. Moreover, in the figures, like reference numerals designate corresponding parts throughout the different views.

DETAILED DESCRIPTION

A reverse voltage applied across the PN junction of a semiconductor device creates a region where there is little current and few electrons or holes. This region is called the depletion region. In a FET device, this region can be formed in the "channel" of the FET. Essentially devoid of carriers, it behaves as the dielectric of a capacitor, and the capacitance is variable with voltage.

Examples of the construction of BiFET devices are shown in U.S. Pat. No. 5,250,826, and U.S. Pat. No. 6,906,359, both of which are incorporated into this document by reference.

Regardless of the manner in which constructed, one of the characteristics exhibited by a FET device, and in particular, a FET device formed in a BiFET process, or other processes, is that when the device is switched off, the channel region exhibits a capacitance that can be varied by varying the reverse voltage applied to the "gate" and/or to the "back gate" of the FET. In this manner, the FET behaves like a varactor.

The continuous tunable LC resonator using a FET as a varactor can be fabricated using a variety of materials. In the embodiments using the technology described in FIG. 1, the continuous tunable LC resonator using a FET as a varactor is fabricated using elements from groups III and V to form materials in various binary, ternary and quaternary combinations, and in an embodiment, is fabricated using the indium gallium phosphide (InGaP)/gallium arsenide (GaAs) material system.

In an embodiment, complementary metal oxide semiconductor (CMOS) technology can be used to fabricate an NFET or a PFET, which can also be used to implement a continuous tunable LC resonator using a FET as a varactor. When bipolar devices are merged into a CMOS process, the technology is commonly known as BiCMOS. In an alternative embodiment, silicon junction field effect transistor (JFET) technology can be used to implement a continuous tunable LC resonator using a FET as a varactor. JFET technology can also be merged with silicon bipolar technology.

The continuous tunable LC resonator using a FET as a varactor can be used in applications including, but not limited to, an input radio frequency (RF) switch in a power amplifier module. Such a switch is also referred to as an "RF pass gate" and may exhibit a narrow frequency bandwidth. However, the continuous tunable LC resonator using a FET as a varactor can be used in any other circuit that uses a tunable LC resonant circuit.

Figure 1:
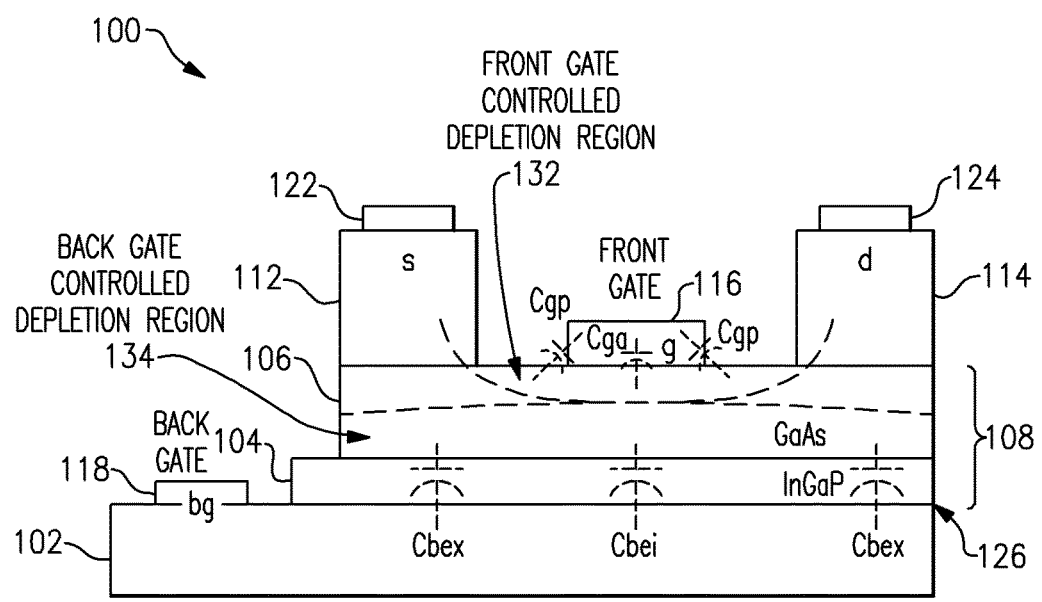
FIG. 1 is a cross-sectional view of a FET in a BiFET process, which can function as a varactor.

FIG. 1 is a cross-sectional view of a FET 100 in a BiFET process, which can function as a varactor. Although a FET that can function as a varactor can be fabricated using other technologies, one of which will be described below, BiFET technology is attractive for this application because it allows the FET to exhibit a wide tuning range. The epitaxial layer structure shown in FIG. 1 forms a FET 100 that incorporates a MESFET into the emitter layers of an HBT, where, in FIG. 1, some of the layers showing the HBT portion of the device are omitted for simplicity. Only the FET portions of the BiFET process that are pertinent to the description of the continuous tunable LC resonator using a FET as a varactor are described herein.

The FET 100 uses portions of a base 102 formed using a layer of gallium arsenide (GaAs) over which an emitter 104 is formed using layers of gallium arsenide (GaAs) and indium gallium phosphide (InGaP). A PN junction 126 is formed at the interface of the base 102 and the emitter 104. Although not shown for clarity, as known in the art, the emitter 104 generally comprises a lightly doped emitter layer, a lightly doped emitter cap layer, and a heavily doped emitter contact layer. A back gate contact 118 is formed from an ohmic metal deposited on an exposed surface of the base 102, approximately as shown. The back gate contact 118 is also understood as the back gate.

A channel 108 is formed under the front gate contact 116 by the indium gallium phosphide (InGaP) layer forming the emitter 104 and the gallium arsenide (GaAs) layer 106. While shown as comprising layers 104 and 106, the channel 108 is created by depletion regions 132 and 134 formed in portions of the layers 104 and 106 under particular electrical conditions to be described below. A front gate contact 116 having a Schottky barrier characteristic is located above the layer 106. A source 112 and a drain 114 are located on a "mesa" above the layer 106. The front gate contact 116 is also understood as including the front gate.

The layers of the epitaxial structure shown in FIG. 1 are the basic layers of a device. Other and/or additional layers may be incorporated into the device 100, depending on process and manufacturing technology.

A source contact 122 is formed on the source 112 and a drain contact 124 is formed on the drain 114. A voltage applied to the front gate contact 116 influences a front-gate controlled depletion region 132 and a voltage applied to the back gate contact 118 influences a back-gate controlled depletion region 134. Although the front gate contact 116 is shown as electrically connected to the back gate contact 118 in FIG. 1, this is not the case for all embodiments. In an alternative embodiment, the front gate contact 116 can be electrically isolated from the back gate contact 118 so as to form a four terminal FET. Such a device is shown schematically and described in FIG. 4. Depending on the embodiment, the voltage applied to the front gate contact 116 can be the same or different than the voltage applied to the back gate contact 118. Further, a reverse voltage can be applied to only the front gate contact 116 or to the back gate contact 118. In accordance with an embodiment, a reverse voltage applied to the front gate contact 116 and/or to the back gate contact 118 changes the capacitance of the channel 108 when the FET is off. The capacitance of the channel appears as a capacitance between the source 112 and drain 114.

In an embodiment, the back gate contact 118 can be electrically coupled to the front gate contact 116, so that the reverse voltage applied to the front gate contact 116 and to the back gate contact 118 is the same.

The total gate capacitance of the FET is determined by a number of individual capacitances. For example, the front gate capacitance, Cg, comprises the area component of the Schottky gate capacitance, Cga, plus the periphery component of the Schottky gate capacitance, Cgp. The capacitance of the back gate, Cbg, comprises the base emitter junction capacitance in the region outside of the gate Cbex, plus the base emitter junction capacitance under the front gate, Cbei. Therefore, the total gate capacitance, Cg_total, of the FET 100 equals Cg plus Cbg in an embodiment in which the backgate contact 118 and the front gate contact 116 are electrically connected together as described in FIG. 3.

When the FET 100 is turned off, the capacitance component of the channel 108 is constant. However, the depletion depth for the capacitance Cgp increases with increasing negative voltage applied to the front gate contact 116 and the depletion depth for the capacitance Cbex and the capacitance Cgp increases with increasing negative voltage applied to the back gate contact 118. Therefore the total capacitance, Cg_total, for the FET 100 decreases with increasing negative voltage on the front gate contact 116 or the back gate contact 118. In an embodiment, the front gate contact 116 and the back gate contact 118 are electrically connected so that they receive the same reverse voltage. However, the front gate contact 116 and the back gate contact 118 may be separate nodes and have different reverse voltages applied.

Changing the reverse voltage applied to the front gate contact 116 and/or to the back gate contact 118 changes the capacitance of the FET 100 continuously over a range of reverse voltage, as will be described below. By changing the capacitance of the FET 100, the drain-to-source RF isolation of the FET can be improved when the device is off because the off-capacitance of the FET 100 can be resonated out using an inductor (FIGS. 3 and 4) connected parallel across the source 112 and the drain 114. This is so because the resonant frequency of the FET 100 varies continuously with the reverse voltage applied on the front gate contact 116 and/or the back gate contact 118. Depending on the parameters of the FET 100, the capacitance of the FET changes linearly with the reverse voltage applied to the front gate contact 116 and/or to the back gate contact 118, at least over a range of reverse voltage.

In an embodiment, the FET 100 can be implemented as a RF pass gate, where the capacitance of the FET 100 is tuned out by an external inductance, as will be described below. As an RF pass gate, the FET 100 could be used to create a switch that has frequency rejection characteristics beyond that of ON-OFF control. For example, a first signal having a first frequency, freq1, passes through the switch (with minimal attenuation ~3 dB), and a second signal having a second frequency, freq2, is blocked. After retuning the FET 100, the first signal having the first frequency, freq1, can be blocked, and the second signal having the second frequency, freq2, can pass through the switch (with minimal attenuation, ~3 dB). Such an RF pass gate application is useful wherever a tunable narrow-band pass gate is needed. This contrasts with the condition when the switch is operated in the ON mode, where all frequencies are passed through with much lower loss (~0.5 dB).

As another example, the FET 100 can be used as a tunable output match element in an RF circuit.

Because the FET 100 is fabricated over the PN junction 126, a relatively large amount of parasitic capacitance results. However, the structure of the FET 100 also allows for the availability of the back gate 118. The back gate 118 allows tuning of this parasitic capacitance by varying the reverse voltage applied to the back gate contact 118, to achieve a broad tuning range.

Figure 2:
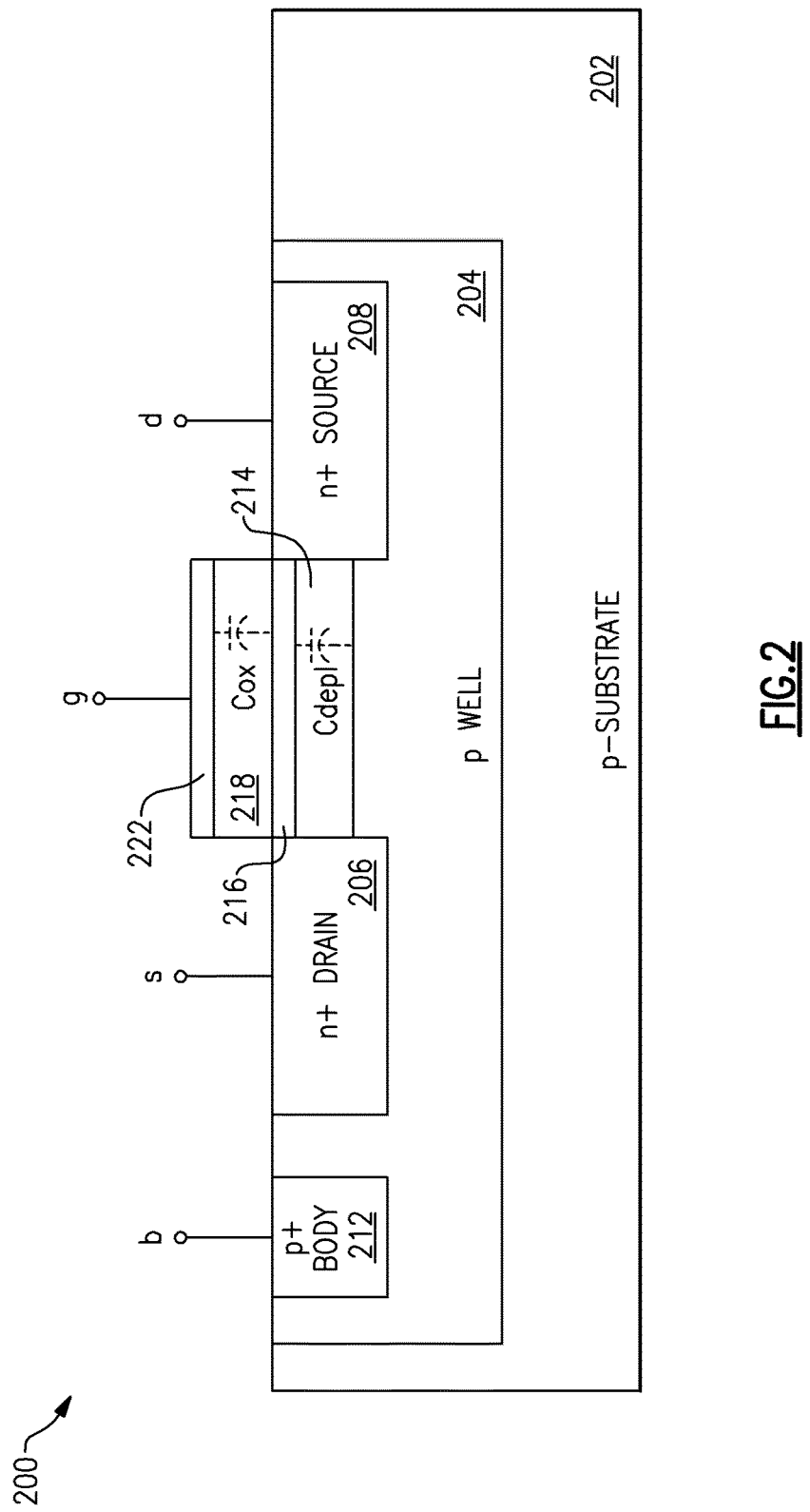
FIG. 2 is a cross-sectional view of a CMOS NFET device which can function as a varactor.

FIG. 2 is a cross-sectional view of a CMOS NFET device which can be used to implement a continuous tunable LC resonator using a FET as a varactor. A PFET device may also be implemented.

The FET 200 comprises a p- substrate 202 into which a p-type well region 204 is formed. The p-type well region 204 can be formed by ion implantation, diffusion, or other techniques that are known to those skilled in the art.

An n+ region 206 that forms the drain of the FET 200 is formed in the p-type well region 204. An n+ region 208 that forms the source of the FET 200 is formed in the p-type well region 204. A p+ region 212 that forms the body of the FET 200 is formed in the p-type well region 212. The region 206 will alternatively be referred to as the "drain," the region 208 will also be referred to as the "source," and the region 212 will alternatively be referred to as the "body."

A depletion layer 214 is formed in the p-type well region 204, and an inversion layer 216 is formed in the p-type well region 204 over the depletion layer 214.

An oxide layer 218, also referred to as a "gate oxide" is formed on a surface of the p-type well region 204 over the inversion layer 216. A metal or polysilicon layer 222 is formed over the oxide layer 218 and forms the "gate" of the FET 200.

The capacitance of the gate 222 comprises gate oxide capacitance, Cox, and depletion capacitance, Cdepl. Varying the bias voltage applied to the body 212 affects the depletion capacitance, Cdepl, thus allowing the FET 200 to behave as a varactor.

If the voltage that is applied to gate 222 is higher than the threshold voltage of the FET 200, an inversion layer 216 forms below the gate oxide 218 and the gate oxide capacitance Cox shields the depletion capacitance, Cdepl, and the FET 200 functions normally. In such a situation, the total capacitance change obtained by varying the bias voltage applied to the body 212 from 0V to a negative voltage is minimum.

However, if the voltage that is applied to gate 222 is lower than the threshold voltage of the FET 200, the total gate capacitance is the serial combination of the gate oxide capacitance, Cox, and the depletion capacitance, Cdepl, giving Cox*Cdepl/(Cox*Cdepl)~Cdepl, and the tuning range of the capacitance is significant at voltage levels below threshold voltage. The capacitance Cox is significantly higher than the capacitance Cdepl; therefore the total capacitance is approximately equal to the depletion capacitance Cdepl.

As described above, in an embodiment, the FET 200 can also be implemented as a RF pass gate, where the capacitance of the FET 200 is tuned out by an external inductance.

Figure 3:
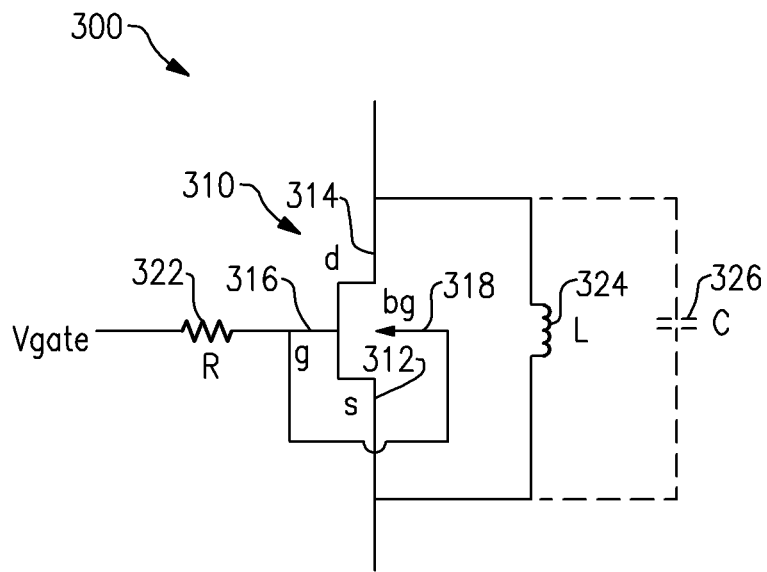
FIG. 3 is a schematic diagram illustrating an embodiment of the FET of FIG. 1 implemented as a varactor.

FIG. 3 is a schematic diagram illustrating an embodiment of the FET 100 of FIG. 1 implemented as a varactor. The schematic diagram 300 includes a FET 310 that includes a front gate 316, a source 312 and a drain 314. The FET 310 also includes a back gate 318 that, in this embodiment, is electrically connected to the front gate 316 so that the front gate 316 and the back gate 318 receive the same voltage, Vgate. The resistor 322 is connected in series with the front gate 316, and an inductor 324 is coupled in parallel across the source 312 and the drain 314. Optionally, a capacitor 326 is coupled in parallel across the inductor 324. In an embodiment, the inductor 324 can have an inductance value of approximately 7 nanohenry (nH). Depending on the width of the gate and the operating frequency of the FET 310, the capacitor 326 may be omitted (for example, for a gate width of less than 800 micrometers (um) operating at 2 GHz). The values of the components are highly dependent on the physical layout of the circuit 300 and the technology used to fabricate the devices. In accordance with varying the reverse voltage applied to the front gate 316 and to the back gate 318, and therefore, varying the capacitance of the FET 310, the drain-source (d-s) isolation provided by the FET 310 is improved by resonating out the capacitance of the FET 310 using the parallel inductor 324.

A radio frequency (RF) signal applied to the source 312, causes the gate 316 and the backgate 318 into a condition referred to as "RF float" due to the relatively high resistance of the resistor 322. The capacitance experienced by the inductance 324 varies with the applied gate or back gate voltage, and is the capacitance across the source 312 and the drain 314. The source-drain capacitance is essentially the parallel summation of the front gate capacitance, Cg, and the backgate capacitance, Cbg.

When analyzing the capacitance experienced by the inductor 324, the backgate capacitance, Cbg, is the series summation of the drain-to-back gate capacitance, Cdrain-bg, and the source-to-back gate capacitance, Csource-bg. The front gate capacitance, Cg, is the series summation of the drain-to-gate capacitance, Cdrain-to-gate and the source-to-gate capacitance, Csource-to-gate.

This leads to a condition in which the resonant frequency of the FET 310 varies with the reverse voltage applied to the front gate 316 and/or to the back gate 318. The reverse bias voltage applied to the front gate 316 modulates the width of the front gate controlled depletion region 132 (FIG. 1) and the reverse bias voltage applied to the back gate 318 modulates the width of the back gate controlled depletion region 134 (FIG. 1) to change the overall capacitance between the source 312 and the drain 314.

Figure 4:
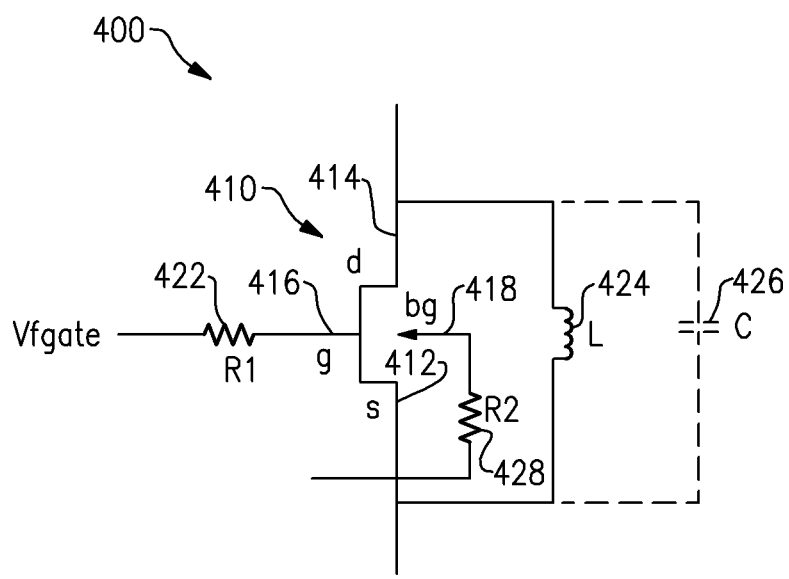
FIG. 4 is a schematic diagram illustrating an alternative embodiment of the circuit of FIG. 3.

FIG. 4 is a schematic diagram illustrating an alternative embodiment of the FET 100 of FIG. 1. The schematic diagram 400 includes a FET 410 that includes a front gate 416, a source 412 and a drain 414. A front gate voltage, Vfgate, is applied to the front gate 416 through a resistor 422. The FET 410 also includes a back gate 418 that, in this embodiment, is electrically separated from the front gate 416. The resistor 422 is connected in series with the front gate 416, and an inductor 424 is coupled in parallel across the source 412 and the drain 414. Optionally, a capacitor 426 is coupled in parallel across the inductor 424. The back gate 418 receives a back gate voltage, Vbgate, through a resistor 428.

In the embodiment shown in FIG. 4, a reverse voltage, Vfgate, can be applied to the front gate 416 independently of a reverse voltage, Vbgate, applied to the back gate 418. In accordance with varying the reverse voltage applied to the front gate 416 and/or to the back gate 418, and therefore, varying the capacitance of the FET 410, the isolation provided by the FET 410 is improved by resonating out the capacitance of the FET 410 using the parallel inductor 424, as described above with respect to FIG. 3. As an example, the ability to apply independent voltage signals to the front gate 416 and the back gate 418 creates a four terminal FET switch that can resonate at two different frequencies as a function of a digital controller (not shown).

It should be noted that a negative front gate or back gate voltage is applied if the FET device is an n-type device, i.e., an NFET. However, if the FET device is a p-type device, such as a PFET, then the front gate or back gate voltage would be positive.

Figure 5:
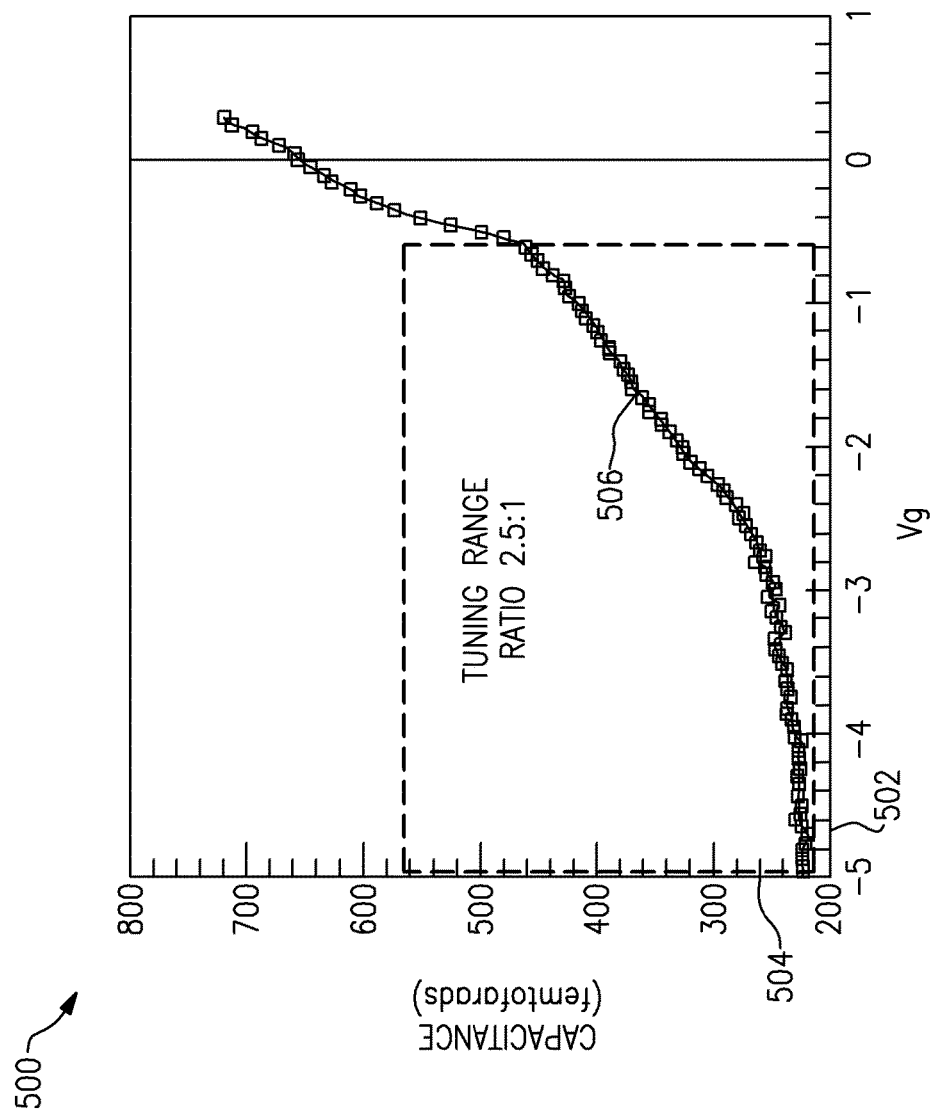
FIG. 5 is a graphical illustration showing the tuning range of the FET of FIG. 1.

FIG. 5 is a graphical illustration 500 showing the tuning range of the FET 100 of FIG. 1. The abscissa 502 represents gate voltage and the ordinate 504 represents total gate capacitance, $C_{g\_total}$, in femtofarads (fF). As shown in FIG. 5, the trace 506 illustrates an approximate 2.5:1 continuous tuning range ratio when the reverse voltage applied to the front gate or back gate of the FET 100 of FIG. 1 changes from approximately −0.5V to approximately −5.0V. In the example shown in FIG. 5, the tuning range refers to the ratio of capacitance change in the range of the varying applied voltage. In this example, the capacitance changes from approximately 200 fF to approximately 500 fF over the applied gate/backgate voltage range. Therefore, in this example, the tune range is 500 fF/200 fF=2.5:1.

As shown in FIG. 5, the continuous tunable LC resonator using a FET as a varactor provides a wide tuning range with near-linear C-V response, at least over a particular voltage range, such as, for example, −0.6V to −2.8V.

Figure 6:
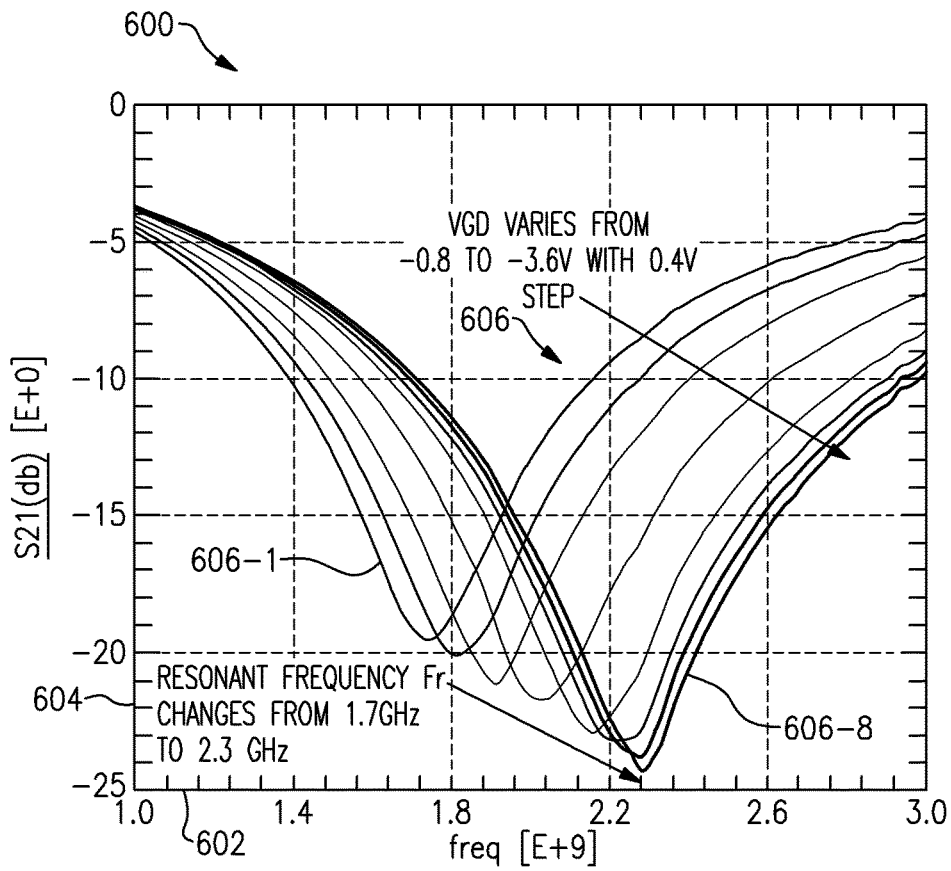
FIG. 6 is a graphical illustration showing a measurement of Scattering parameter, S21, versus frequency of the implementation shown in FIG. 3.

FIG. 6 is a graphical illustration 600 showing a measurement of Scattering parameter, S21, versus frequency of the implementation shown in FIG. 3. In the example shown in FIG. 6, the inductor 324 of FIG. 3 has L=13.2 nH and the FET 310 includes has 8 elements, each having a width of 100 um, such that the net FET width is 800 μm. The abscissa 602 represents frequency in gigahertz (GHz) and the ordinate 604 represents the scattering parameter, S21, in dB. As shown in FIG. 6, the traces 606 illustrate the manner in which the resonant frequency, Fr, of the FET 100 (FIG. 1) changes from approximately 1.7 GHz to approximately 2.3 GHz as the gate voltage varies from approximately −0.8V (606-1) to approximately −3.6V (606-8) over 0.4V steps.

Figure 7:
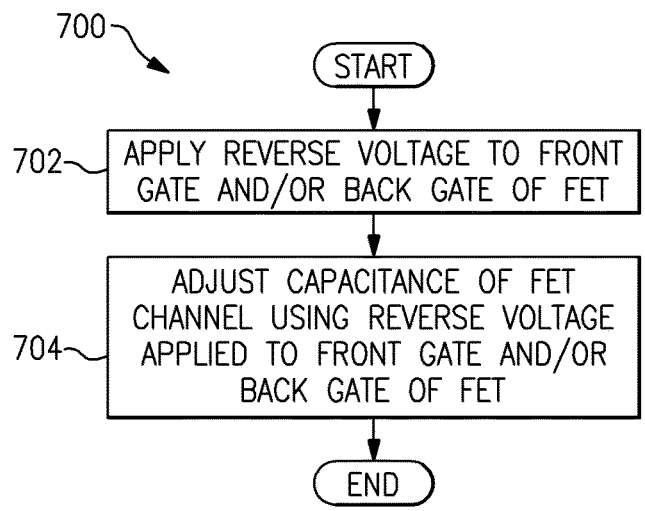
FIG. 7 is a flow chart describing the method of operation of a circuit embodiment using a FET of FIG. 1 or 2 as a varactor.

FIG. 7 is a flow chart describing the operation of an embodiment of the continuous tunable LC resonator using a FET as a varactor of FIG. 1 and FIG. 2. In block 702, a reverse voltage in the range of approximately −0.4V to −5.0V is applied to the any of the front gate 116 (gate 222 of FIG. 2) and the back gate 118 (body 212 of FIG. 2). In block 704, the capacitance of the FET is adjusted according to the applied reverse voltage.

Figure 8:
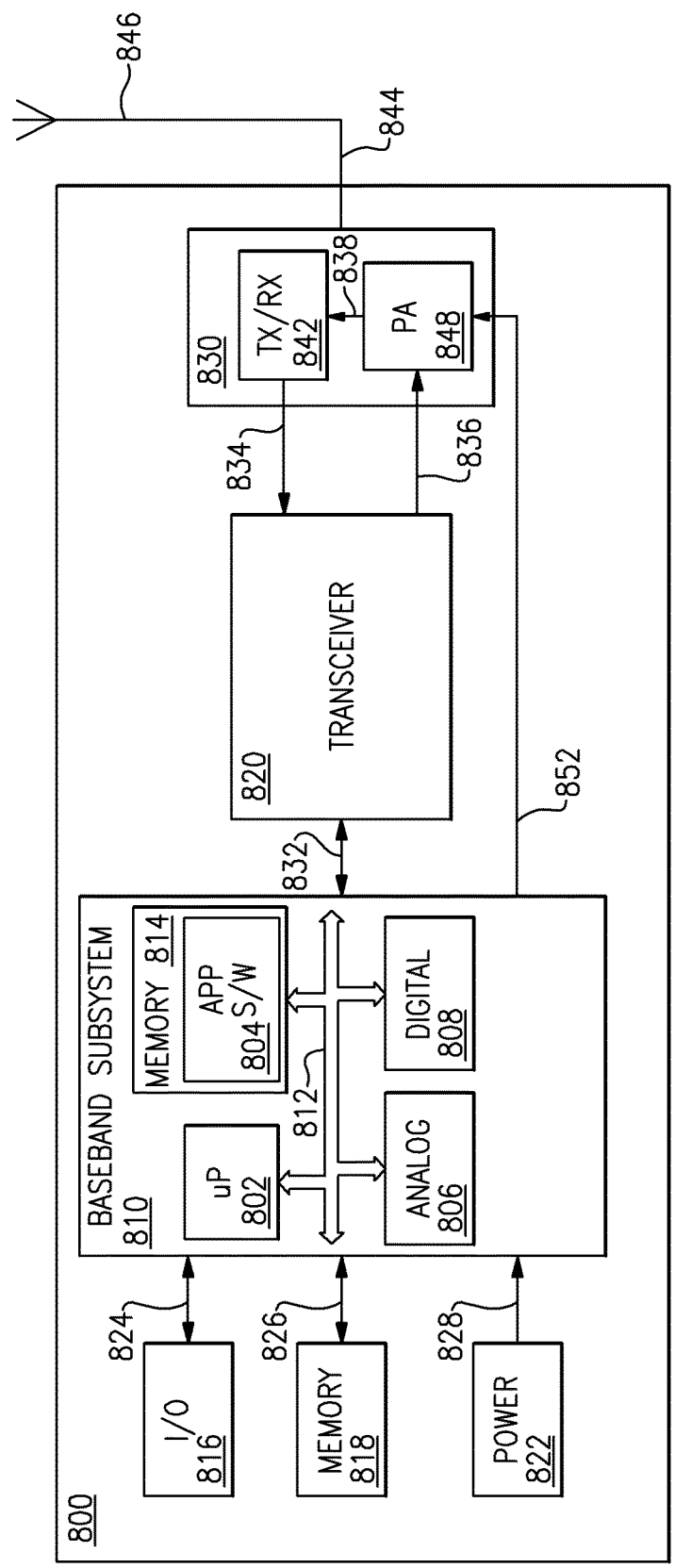
FIG. 8 is a block diagram illustrating a simplified portable communication device.

FIG. 8 is a block diagram illustrating a simplified portable communication device 800 in which an embodiment of the continuous tunable LC resonator using a FET as a varactor can be implemented. In an embodiment, the portable communication device 800 can be a portable cellular telephone. Embodiments of the continuous tunable LC resonator using a FET as a varactor can be implemented in any device in which a tunable LC resonator is desired, and in this example, are implemented in a portable communication device 800. The portable communication device 800 illustrated in FIG. 8 is intended to be a simplified example of a cellular telephone and to illustrate one of many possible applications in which the continuous tunable LC resonator using a FET as a varactor can be implemented. One having ordinary skill in the art will understand the operation of a portable cellular telephone, and, as such, implementation details are omitted.

The portable communication device 800 includes a baseband subsystem 810, a transceiver 820, and a Front-End Module (FEM) 830. Although not shown for clarity, the transceiver 820 generally includes modulation and upconversion circuitry for preparing a baseband information signal for amplification and transmission, and includes filtering and downconversion circuitry for receiving and downconverting an RF signal to a baseband information signal to recover data. The details of the operation of the transceiver 820 are known to those skilled in the art.

The baseband subsystem generally includes a processor 802, which can be a general purpose or special purpose microprocessor, memory 814, application software 804, analog circuit elements 806, and digital circuit elements 808, coupled over a system bus 812. The system bus 812 can include the physical and logical connections to couple the above-described elements together and enable their interoperability.

An input/output (I/O) element 816 is connected to the baseband subsystem 810 over connection 824, a memory element 818 is coupled to the baseband subsystem 810 over connection 826 and a power source 822 is connected to the baseband subsystem 810 over connection 828. The I/O element 816 can include, for example, a microphone, a keypad, a speaker, a pointing device, user interface control elements, and any other device or system that allows a user to provide input commands and receive outputs from the portable communication device 800.

The memory 818 can be any type of volatile or non-volatile memory, and in an embodiment, can include flash memory. The memory element 818 can be permanently installed in the portable communication device 800, or can be a removable memory element, such as a removable memory card.

The power source 822 can be, for example, a battery, or other rechargeable power source, or can be an adaptor that converts AC power to the correct voltage used by the portable communication device 800. In an embodiment, the power source can be a battery that provides a nominal voltage output of approximately 3.6 volts (V). However, the output voltage range of the power source can range from approximately 3.0 to 6.0 V.

The processor 802 can be any processor that executes the application software 804 to control the operation and functionality of the portable communication device 800. The memory 814 can be volatile or non-volatile memory, and in an embodiment, can be non-volatile memory that stores the application software 804.

The analog circuitry 806 and the digital circuitry 808 include the signal processing, signal conversion, and logic that convert an input signal provided by the I/O element 816 to an information signal that is to be transmitted. Similarly, the analog circuitry 806 and the digital circuitry 808 include the signal processing, signal conversion, and logic that convert a received signal provided by the transceiver 820 to an information signal that contains recovered information. The digital circuitry 808 can include, for example, a Digital Signal Processor (DSP), an FPGA, or any other processing device. Because the baseband subsystem 810 includes both analog and digital elements, it is sometimes referred to as a mixed signal circuit.

In an embodiment, FEM 830 includes a Transmit/Receive (T/R) switch 842 and a power amplifier module 848. The T/R switch 842 can be a duplexer, a diplexer, or any other physical or logical device or circuitry that separates a transmit signal and a receive signal. Depending on the implementation of the portable communication device 800, the T/R switch 842 may be implemented to provide half-duplex or full-duplex functionality. A transmit signal provided by the transceiver 820 over connection 836 is directed to the power amplifier module 848. The power amplifier module may include one or more amplifier stages and may also include the continuous tunable LC resonator using a FET as a varactor as an input radio frequency (RF) switch.

The output of the power amplifier module 848 is provided over connection 838 to the T/R switch 842, and then to an antenna 846 over connection 844.

A signal received by the antenna 846 is provided over connection 844 to the T/R switch 842, which provides the received signal over connection 834 to the transceiver 820 for receive signal processing as known in the art.

Figure 9:
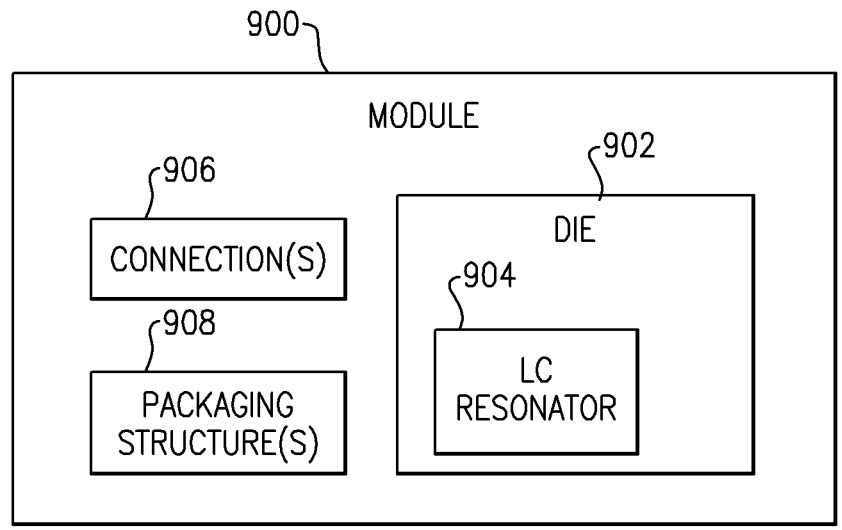
FIG. 9 is a block diagram illustrating a module that includes a die having an LC resonator with one or more features described herein.

FIG. 9 is a block diagram illustrating a module 900 that can be included in the portable communication device 800 of FIG. 8. In the context of the example described in reference to FIG. 8, the module 900 can include components and functionalities associated with the power amplifier module 848. More particularly, the module 900 can include a semiconductor die 902 having one or more integrated circuits (ICs) configured to provide power amplification of RF signals. The module 900 can further include an LC resonator 904 having one or more features described herein. It will be understood that other types of modules associated with RF applications can also benefit by having such an LC resonator.

In some embodiments, the module 900 can further include a number of parts that can facilitate various operations of the IC(s) of the die 902. For example, one or more connections 906 can be provided and configured to allow transfer of RF signals and power to and/or from the die 902. In another example, one or more packaging structures 908 can be provided and configured to, for example, yield protection for the die 902 and to allow easier handling.

Figure 10:
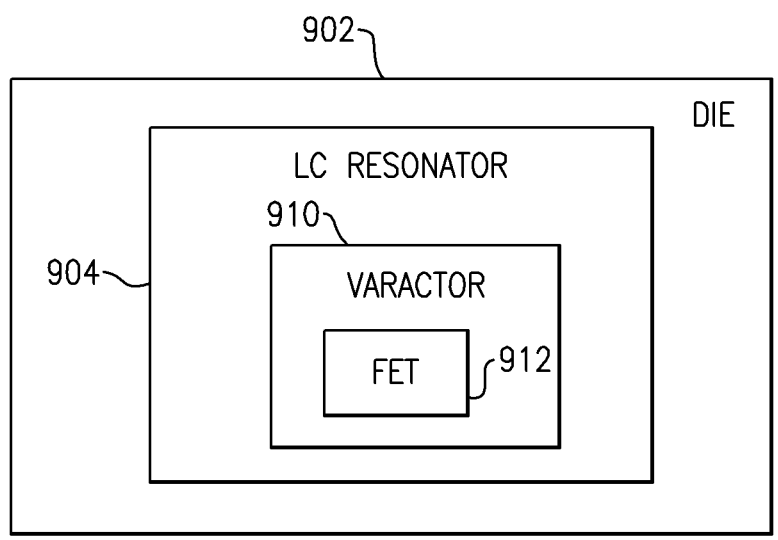
FIG. 10 is a block diagram illustrating a die that can be included in the module of FIG. 9.

FIG. 10 is a block diagram illustrating a die 902 that can be included in the module 900 of FIG. 9. As described in reference to FIG. 9, the die 902 can include one or more ICs and an LC resonator 904 having one or more features described herein. The LC resonator 904 can include a varactor 910 having an FET 912 configured to operate as described herein.

While various embodiments of the invention have been described, it will be apparent to those of ordinary skill in the art that many more embodiments and implementations are possible that are within the scope of this invention.

What is claimed is:

1. A continuous tunable inductive capacitive resonator comprising:
   a bipolar junction transistor including a base and an emitter;
   a field effect transistor integrated with at least a portion of the bipolar junction transistor, at least one of a back gate or a front gate of the field effect transistor sharing an electrical connection with the base of the bipolar junction transistor, a reverse voltage applied to the at least one of the back gate or the front gate of the field effect transistor creating a continuously variable capacitance in a channel of the field effect transistor; and
   an inductor arranged to experience a capacitance that varies with the reverse voltage applied to the at least one of the back gate or the front gate of the field effect transistor, the front gate of the field effect transistor electrically connected to the back gate of the field effect transistor.

2. The continuous tunable inductive capacitive resonator of claim 1 wherein the reverse voltage applied to the back gate or to the front gate ranges from −0.4 to −5.0 volts.

3. The continuous tunable inductive capacitive resonator of claim 1 wherein the changes in variable capacitance are continuous over a range of the reverse voltage.

4. The continuous tunable inductive capacitive resonator of claim 3 wherein the continuously variable capacitance is a gate capacitance of the field effect transistor.

5. The tunable resonator of claim 1 wherein the field effect transistor further comprises a source and a drain.

6. The continuous tunable inductive capacitive resonator of claim 1 wherein the variable capacitance is achieved with a substantially linear capacitance-voltage response, at least over a predefined voltage range.

7. The continuous tunable inductive capacitive resonator of claim 1 further comprising the inductor connected parallel across the source and drain of the field effect transistor.

8. A continuous tunable inductive capacitive resonator comprising:
   a bipolar junction transistor including a base and an emitter;
   a field effect transistor integrated with at least a portion of the bipolar junction transistor, at least one of a back gate or a front gate of the field effect transistor sharing an electrical connection with the base of the bipolar junction transistor, a reverse voltage applied to the at least one of the back gate or the front gate of the field effect transistor creating a continuously variable capacitance in a channel of the field effect transistor; and
   an inductor arranged to experience a capacitance that varies with the reverse voltage applied to the at least one of the back gate or the front gate of the field effect transistor, the reverse voltage applied to the at least one of the back gate of the field effect transistor or the front gate of the field effect transistor creating a continuously variable inductive capacitance in the channel of the field effect transistor, the channel being formed at least partially in an emitter layer of the bipolar junction transistor.

9. A radio frequency module having a continuous tunable inductive capacitive resonator, the module comprising:
   a packaging substrate configured to receive a plurality of components;
   a die mounted on the packaging substrate, the die including the continuous tunable inductive capacitive resonator including a bipolar junction transistor, a field effect transistor integrated with at least a portion of the bipolar junction transistor, and an inductor, the field effect transistor including at least one of a back gate or a front gate sharing an electrical connection with a base of the bipolar junction transistor, a reverse voltage being applied to the at least one of the back gate or the front gate of the field effect transistor, the inductor arranged to experience a capacitance that varies with the applied reverse voltage, the front gate of the field effect transistor electrically connected to the back gate of the field effect transistor; and
   a plurality of connectors configured to provide electrical connections between the die and the packaging substrate.

10. The radio frequency module of claim 9 wherein the reverse voltage is applied to the front gate of the FET.

11. The radio frequency module of claim 10 wherein the reverse voltage applied to the back gate or to the front gate ranges from −0.4 to −5.0 volts.

12. The radio frequency module of claim 9 wherein the variable capacitance is achieved with a substantially linear capacitance-voltage response, at least over a predefined voltage range.

13. The radio frequency module of claim 9 wherein the changes in the variable capacitance are continuous over a range of the reverse voltage.

14. The radio frequency module of claim 9 implemented as a radio frequency pass gate.

15. The radio frequency module of claim 9 implemented as a power amplifier module.

16. A method of operating a tunable resonator, the method comprising:
applying a reverse voltage to at least one of a back gate or a front gate of a field effect transistor integrated with at least a portion of a bipolar junction transistor, the field effect transistor including a channel having a variable capacitance that changes in response to changes in the reverse voltage, the tunable resonator including the field effect transistor and the bipolar junction transistor further including an inductor arranged to experience a capacitance that varies with the applied reverse voltage, the front gate of the field effect transistor electrically connected to the back gate of the field effect transistor.

17. The method of claim 16 wherein the reverse voltage applied to the back gate or to the front gate ranges from −0.4 to −5.0 volts.

18. The method of claim 16 wherein the changes in the variable capacitance are continuous over a range of the reverse voltage.

19. The method of claim 16 wherein the continuously variable capacitance is a gate capacitance of the field effect transistor.

20. A radio frequency module having a continuous tunable inductive capacitive resonator, the module comprising:
a packaging substrate configured to receive a plurality of components;
a die mounted on the packaging substrate, the die including the continuous tunable inductive capacitive resonator including a bipolar junction transistor, a field effect transistor integrated with at least a portion of the bipolar junction transistor, and an inductor, the field effect transistor including at least one of a back gate or a front gate sharing an electrical connection with a base of the bipolar junction transistor, a reverse voltage being applied to the at least one of the back gate or the front gate of the field effect transistor, the inductor arranged to experience a capacitance that varies with the applied reverse voltage, wherein the reverse voltage applied to the at least one of the back gate of the field effect transistor or the front gate of the field effect transistor creating a continuously variable inductive capacitance in the channel of the field effect transistor, the channel being formed at least partially in an emitter layer of the bipolar junction transistor.

* * * * *